United States Patent [19]

Siuta

[11] Patent Number: 4,540,604

[45] Date of Patent: Sep. 10, 1985

[54] THICK FILM CONDUCTOR COMPOSITIONS

[75] Inventor: Vincent P. Siuta, Cherry Hill, N.J.

[73] Assignee: E. I. Du Pont de Nemours and Company, Wilmington, Del.

[21] Appl. No.: 690,454

[22] Filed: Jan. 10, 1985

Related U.S. Application Data

[62] Division of Ser. No. 526,400, Aug. 25, 1983, Pat. No. 4,514,321.

[51] Int. Cl.$^3$ .............................................. B05D 5/12
[52] U.S. Cl. ..................................... 427/96; 427/102; 427/103; 427/125; 427/126.2; 427/126.3; 427/126.5; 427/376.2; 106/1.13; 106/1.14; 106/1.15; 106/1.18; 106/1.19; 106/1.21; 252/512; 252/514; 252/518; 29/610 R; 29/620; 29/825; 29/829
[58] Field of Search ................ 252/512, 514, 518; 427/96, 101, 102, 99, 103, 123, 125, 126.2, 126.3, 126.5, 375, 376.2, 383.3, 383.5, 385.5, 279; 106/1.13, 1.14, 1.15, 1.18, 1.19, 1.21, 1.24; 29/610 R, 620, 825, 829, 836; 338/20, 307, 308

[56] References Cited

U.S. PATENT DOCUMENTS

| | | | |
|---|---|---|---|
| 2,993,815 | 7/1961 | Treptow | 117/212 |
| 3,246,197 | 4/1966 | Watkins | 313/345 |
| 3,341,363 | 9/1967 | Owens | 117/227 |
| 3,647,532 | 3/1972 | Friedman et al. | 117/212 |
| 3,807,965 | 4/1974 | Tazaki et al. | 29/182.1 |
| 3,988,647 | 10/1976 | Bolon et al. | 317/101 |
| 4,039,721 | 8/1977 | Weitzee et al. | 252/512 |
| 4,051,074 | 9/1977 | Asada | 252/512 |
| 4,070,518 | 1/1978 | Hoffman | 428/209 |
| 4,072,771 | 2/1978 | Grier, Sr. | 427/96 |
| 4,155,758 | 4/1979 | Evans et al. | 75/232 |
| 4,172,919 | 10/1979 | Mitchell | 428/209 |
| 4,172,922 | 10/1979 | Merz et al. | 428/432 |
| 4,371,459 | 2/1983 | Nazarenko | 252/514 |
| 4,379,195 | 4/1983 | Prabhu et al. | 252/512 |
| 4,400,214 | 8/1983 | Ogawa et al. | 252/512 |
| 4,415,624 | 11/1983 | Prabhu et al. | 252/512 |

FOREIGN PATENT DOCUMENTS

| | | |
|---|---|---|
| 0068167 | 5/1983 | European Pat. Off. |
| 064563 | 6/1981 | Japan. |
| 636884 | 3/1978 | U.S.S.R. |

*Primary Examiner*—Josephine L. Barr

[57] ABSTRACT

A copper-containing thick film conductor composition comprising a mixture of finely divided particles of (a) a conductive material containing copper metal, (b) inorganic binder and (c) 0.2–5% wt. of a noncuprous metal selected from the group consisting of tungsten, molybdenum, rhenium and alloys and mixtures thereof all dispersed in organic medium. The metal particles must be within certain narrow ranges of particle size.

2 Claims, No Drawings

THICK FILM CONDUCTOR COMPOSITIONS

This is a division of application Ser. No. 526,400, filed Aug. 25, 1983, now U.S. Pat. No. 4,514,321.

FIELD OF INVENTION

The invention relates to thick film conductor compositions and particularly to such compositions which can be easily soldered after multiple firings.

BACKGROUND OF THE INVENTION

Thick film conductors are widely used as a means of interconnecting various passive and active devices for hybrid microcircuits and resistor networks. Utility as a general purpose conductor requires certain performance attributes such as conductivity, solderability, solder leach resistance, compatibility with other circuit components and ability to be processed under a wide range of conditions. Inherent in the usefulness of thick film conductors is the cost of materials in the composition. It is extremely advantageous to reduce the cost without significantly changing the performance characteristics.

Thick film conductors are comprised of conductive metal and inorganic binder, both of which are in finely divided form and are dispersed in an organic medium. The conductive metal is ordinarily gold, palladium, silver, platinum or mixtures and alloys thereof, the choice of which depends upon the particular combination of performance characteristics which are sought, e.g., resistivity, solderability, solder leach resistance, migration resistance, adhesion and the like.

Thick film techniques are contrasted with thin film techniques which involve deposition of particles by vacuum evaporation or sputtering. Thick film techniques are discussed in *Handbook of Materials and Processes for Electronics,* C. A. Harper, Editor, Mc-Graw-Hill, N. Y. 1970, Chapter 12.

In the current economic climate in which noble metals have experienced substantial fluctuations in price, it is especially attractive from a business viewpoint to substitute less expensive base metals as the conductive metal in thick film conductor compositions. Several base metals have been proposed and used with mixed success as the conductive phase for thick film conductors. Among these the most important is copper which has been formulated in a number of different ways for a wide variety of applications. For example, U.S. Pat. No. 2,993,815 to Treptow is directed to a method of forming a copper conductive layer for printed circuits on a refractory substrate by screen printing a layer of 5-50 parts by weight copper or copper oxide and 1 part by weight of reduction-resistant glass frit dispersed in an organic medium. The conductive layer is formed by firing the applied paste in two stages at 500°-1050° C. On the other hand, U.S. Pat. No. 3,647,532 to Friedman is directed to conductive inks for use on ceramic substrates comprising copper and glass frit dispersed in an organic polymeric binder using a lead borosilicate glass binder containing cadmium oxide. Firing is carried out in a nonoxidizing atmosphere at 820°-850° C.

Bolon et al., U.S. Pat. No. 3,988,647, disclose a conductor composition comprising copper particles which have been treated to remove oxide from the surface dispersed in a solventless polymeric binder. U.S. Pat. No. 4,070,518 to Hoffman is directed to a conductor composition especially for use on dielectric substrates, comprising 85-97% wt. Cu powder and 3-15% wt. of cadmium- and bismuth-free lead aluminoborate glass frit dispersed in an organic medium.

In Grier, U.S. Pat. No. 4,072,771, a conductor composition is disclosed comprising copper particles which have been preoxidized to form a surface layer of CuO and glass frit dispersed in 15-25% wt. organic medium. U.S. Pat. No. 4,172,919 to Mitchell is directed to a conductor composition comprising 86-97% wt. Cu powder, 1-7% wt. CuO and 1-7% wt. of a glass frit containing at least 75% $Bi_2O_3$ dispersed in 10-30% wt. inert organic medium.

In EPO Application No. 0068167 to McCormick et al., a conductor composition is disclosed comprising 65-80 pbw Cu powder, 0-6 pbw CuO and 3-8 pbw of a Bi-free, low melting glass dispersed in an organic medium containing 20-40% wt. methacrylate resin dissolved in volatile solvent.

In applicant's copending U.S. patent application Ser. No. 505,730 (Unofficial) filed June 20, 1983 (Unofficial) (EL-0166), there is disclosed a thick film conductor composition comprising finely divided particles of copper oxide-coated copper and low softening point inorganic binder dispersed in a low resin organic medium.

When copper conductors such as those described above are used in microcircuits, they are frequently subjected to quite rigorous conditions during fabrication. For example, in a typical application, the copper-containing composition is printed on a substrate, dried and fired in a nitrogen atmosphere at 900° C. Then a pattern of resistor material is printed in proper registry atop the conductor layer and the copper-containing composition and overlying layer of resistor material are fired at about the same temperature in nitrogen to effect sintering of the resistor material. Following this, an overglaze may be applied and the entire assemblage is fired in nitrogen once again to sinter the overglaze material. When this is completed, leads are soldered onto the conductive layer. Thus, in this typical situation, the copper is subjected to as many as three high temperature firings and, in some fabrications, the copper-containing layer may be subjected to as many as five such firings. Because of minute amounts of oxygen which remain in the nitrogen firing atmospheres, the copper conductive surface becomes progressively more oxidized. In turn, the progressive oxidation of the copper components of the conductor composition causes poor solderability. In the past, it was necessary to fire in a very pure nonoxidizing atmosphere in a short firing cycle to lessen such oxidation or to limit the use of the composition to applications which do not require multiple firing.

SUMMARY OF THE INVENTION

The invention is therefore directed to a copper-containing thick film conductor composition which overcomes the problems of the prior art by retaining quite good solderability even after multiple firings. In particular, the invention is directed to a copper-containing thick film conductor composition comprising a mixture of finely divided particles of
(a) 85-98.8% wt. conductive material of which at least 28% wt. is copper;
(b) 10-1% wt. inorganic binder; and
(c) 5-0.2% wt. of a noncuprous material selected from the group consisting of tungsten, molybdenum, rhenium and alloys and mixtures thereof dispersed in organic medium, the composition being further characterized in that
(1) the copper particles have a maximum size below 10 μm and an average size of 2–4 μm; and
(2) the noncuprous metal particles have a maximum size below 5 μm and an average size of 0.2–3 μm.

PRIOR ART DISCUSSION

The prior art of copper conductors is silent with respect to the use therewith of refractory metals. Furthermore, no example of the use of tungsten metal in small amounts with copper in the same composition has been found. This is true notwithstanding the fact that tungsten is a widely used material in electronic applications. For example, U.S. Pat. No. 3,246,197 to Watkins discloses a resistive wire composition having a coating of $Al_2O_3$ in admixture with tungsten and U.S. Pat. No. 3,341,363 to Owen discloses a method of making a thick film resistor material comprising a dispersion of finely divided particles of (a) Si, $WO_3$, $MoSi_2$, Co, W, Mg and (b) inorganic binder consisting of kaolin and "glaze" material. Schroeder et al. in U.S. Pat. No. 3,673,117 also discloses a resistor material comprising $RuO_2$ hydrate, bismuth-lead borosilicate glass and 0.01–25% of a high resistance metal such as tungsten. Tozaki in U.S. Pat. No. 3,807,965 discloses a material for conductive contacts comprising finely divided particles of tungsten carbide, cobalt and copper.

It is apparent from the foregoing that in microcircuit applications, tungsten is most frequently used as a resistor rather than a conductor. This is borne out further by Merz et al. in U.S. Pat. No. 4,172,922 who disclose resistor materials comprising finely divided particles of ZnO and up to 5% of any one of several metals, including tungsten, and glass frit. Also, Evans et al. disclose in U.S. Pat. No. 4,455,758 an electrically conductive cermet resistor consisting of finely divided particles of tungsten, $Al_2O_3$ and borosilicate glass. Other tungsten-containing resistor materials are disclosed in U.S.S.R. No. 636,884 to Krasov which covers thick film resistor materials comprising finely divided particles of lead borosilicate glass, $RuO_2$ and metallic tungsten. Furthermore, in Japanese Patent Application 064563, there is mentioned a sintered mixture of finely divided particles of 60–99% wt. tungsten or molybdenum, 0.5–10% wt. Mn or Cu and 0.5–30% wt. BeO or $Al_2O_3$.

In view of the foregoing described prior art, it is apparent that the use of small amounts of tungsten metal with copper in thick film conductors or for improved solderability and adhesion of thick film conductors is completely unsuggested.

DETAILED DESCRIPTION OF THE INVENTION

A. Copper

Both the composition and configuration of the conductive phase are important in the compositions of the invention.

The invention is directed to conductive phases which contain substantial amounts of copper, i.e., which contain at least 28% wt. copper, which is the amount of copper contained in a copper/silver eutectic alloy. The conductive phase can be comprised of particles of copper alone, a mixture of particles of copper and another metal and/or particles of an alloy of copper with another metal, particularly with a noble metal. It is, however, preferred to use only particles of copper as the conductive phase since the invention has wide application for conductive films.

In particular, because the presence of certain impurities in the copper decreases electrical conductivity and interferes with sintering of the copper and the inorganic binder, it is essential as a practical matter that the copper, exclusive of any oxide layer thereon, be at least about 99.5% pure on a weight basis and preferably even higher. This is especially important because with the composition of the invention, it is necessary to obtain maximum electrical conductivity and sintering of the copper particles at relatively low firing temperature (750°–950° C.), which is significantly below the melting point of the copper (1083° C.).

With respect to particle configuration, both particle size and particle shape are very important. To attain suitable sintering and complete burnout of organic medium and optimum screen printing properties, it is essential that the copper particles have a maximum particle size below 10 μm and an average particle size of 2–4 μm. Within these limits, it is preferred that the copper powder particles have a surface area of less than 1 $m_2/g$ and preferably 0.2–0.5 $m_2/g$, depending on the particle size.

In addition to the foregoing compositional and configurational criteria, it is preferred that the copper particles be at least partially coated with a layer of copper oxide. While it is preferred that the copper oxide coating constitute at least 1% copper oxide by weight of the coated copper particles, it is still further preferred that the amount of copper oxide coating be even higher, e.g., 4–10% by weight. However, it is essential that the oxide coating not exceed about 15% by weight of the oxide-coated particle. Above about 15% by weight oxide, the terminations made therewith become more difficult to solder and tend to dewet upon repeated immersion in molten solder.

Most available finely divided copper metal has an oxide coating which constitutes at least 2–3% by weight of the particle. However, if it is desired to increase the oxide coating, this can be done by agitating and heating the particles in air. On the other hand, spherical particles of even higher oxide content can be made by atomizing the copper in air or an atmosphere containing a controlled amount of oxygen.

Because of the more intimate contact between the oxide and the organic medium when the oxide is on the copper particles, it is preferred that most, and preferably all, of the copper oxide in the composition of the invention be derived from the coating on the dispersed copper particles. The remainder of the oxide needed for the composition, if any, can be supplied by the addition of particles of copper oxide to the composition and/or by the inclusion of copper oxide in the inorganic binder. Any additional oxide can be provided by either method or by both. However, as indicated above, the total copper oxide in the composition must not exceed about 15% by weight of the oxide coated copper particles.

In general, the amount of oxygen as copper oxide from all sources (oxide coating on the copper powder, and $Cu_2O$ and CuO added separately or to the glass frit) must be about 1.0% weight of the total copper in order to get good substrate adhesion, but not more than about 2.0% weight in order to maintain good solderability.

Copper powders of high purity and low surface oxide content (<0.3% wt. oxygen) are likely to yield copper conductors having low adhesion unless additional copper oxides are added.

The conductive phase may contain other conductive metals so long as these other materials are inert and do not interfere with the copper oxide decomposition, tungsten oxide formation and the sintering of the copper and the inorganic binder during firing. Thus in special cases, if desired, the copper can be admixed with other base metals or even with noble metals. In theory, even major amounts of noble metals can be used in conjunction with the copper/copper oxide conductive phase. However, it is obvious that the economic advantages of the invention are reduced accordingly. Moreover, it is preferred that the addition of such metals be minimized lest the added metal particles interfere with the interactions among the copper, copper oxide, tungsten and inorganic binder and thereby degrade the properties of the fired thick film.

Silver is a preferred noble metal for use with copper in the compositions of the invention. From 1-50% wt. silver, basis total copper content, and preferably 5-20% wt. silver can ordinarily be used. However, eutectic proportions of silver relative to the copper can also be used. The Ag/Cu eutectic is 72% wt. Ag/28% wt. Cu.

The importance of copper particle size and copper oxide content in conductive compositions is set out in copending U.S. patent application Ser. No. 505,730 filed June 20, 1983, which is incorporated herein by reference.

B. Noncuprous Metal

The noncuprous metals which can be used in the invention are tungsten, molybdenum and rhenium. Mixtures or alloys of these metals may be used as well.

The amount of noncuprous metal in the composition of the invention is quite critical and must lie within the range of 0.2-5.0% wt. basis total solids. At least 0.2% wt. is required to obtain significant improvements in solderability. However, above 5.0% wt., the beneficial effect on solderability does not increase further and adhesion of the copper film to the substrate is reduced. It is preferred that the tungsten content of the composition be within the range of 0.5-3% wt.

An interesting feature of the invention is the great importance of the particle size of the tungsten to its effectiveness in the invention. In particular, the noncuprous metal particles and especially tungsten must have a maximum dimension below 5 $\mu$m and the average size must be within the range of 0.2-3 $\mu$m. The reason for such criticality is not known with certainty. However, it is believed to be closely related to the ability of the metal to be uniformly dispersed within the body and over the surface of the copper-film.

It is well known that clean metal surfaces have a high surface energy which results in a strong gradient toward a lower energy state. Such surfaces easily adsorb gases such as oxygen which react chemically with strongly electropositive metal atoms to form a strongly bonded oxide layer on the surface (see Pask, *Glass-Metal "Interfaces" and Bonding*, U. of California, Lawrence Radiation Laboratory, Berkeley, CA, Report UCRL 10611, 1963). By virtue of this mechanism, most metal surfaces which have been cleaned contain a layer of oxide. Furthermore, more reactive metals such as copper will normally have a substantial oxide coating in the absence of special treatments to avoid such oxidation. In the case of tungsten, it is believed that the minute particles of tungsten, which are incapable of forming an alloy with copper, react with surface oxide on the copper film and the small amount of oxygen in the furnace atmosphere to form $WO_2$ and/or $W_2O_5$ which are removed from the particle surfaces during firing by sublimation.

Both molybdenum and rhenium appear to be effective in a similar manner, though the precise details of their reaction with the surface oxide, frit and furnace atmosphere are not yet completely understood.

This process leaves a substantially oxide-free copper surface which is more readily wet by solder and therefore gives better solderability. Of particular interest, however, is that the copper-containing compositions of the invention can be refired several times and retain this improved level of solderability.

C. Inorganic Binder

Glasses and other inorganic binders used in conductors perform several functions. The primary function of binders is to provide chemical or mechanical bonding to the substrate. They also may facilitate sintering of the metal film by means of liquid phase sintering when the glassy binder wets the conductor surface. It is preferred that the glass binder have a softening point below 800° C. in order that the glass have adequate flow properties. This is needed for adhesion to the substrate and, in some cases, for protection of the conductive material. A softening point of about 400°-600° C. is preferred.

Although the chemical composition of the binder system is not critical to the functionality of these thick film conductor compositions, the inorganic binder should melt or flow at a sufficiently low temperature to aid sintering of the metal particles during firing.

The inorganic binder is preferably a low softening point, low viscosity glass which is used at a level of 1-10% wt. and preferably at 2-8% wt, basis solids. As used herein, the term low softening point glass is one having a softening point at least about 100° C. below the intended peak firing temperature as measured by the fiber elongation method (ASTM-C338-57). The glass utilized in this invention must also have a low viscosity at the firing temperature to aid liquid phase sintering of inorganc particulates. A glass having a specific viscosity (log $\eta$ of less than 6) at the firing temperature will aid liquid phase sintering and is therefore preferred.

Lead borosilicate glasses have been used extensively in the invention and found to be excellent from the viewpoint of low softening point and good adhesion to the substrate. However, in order to assure good hermeticity and moisture resistance, it is preferred to use low borate glasses, that is, those containing below about 20% by weight $B_2O_3$ or its equivalent. Both reducing- and nonreducing-type glasses are operable.

The glasses are prepared by conventional glassmaking techniques by mixing the desired components in the desired proportions and heating the mixture to form a melt. As is well known in the art, heating is conducted to a peak temperature and for a time such that the melt becomes entirely liquid and homogeneous. In the present work, the components were premixed by shaking in a polyethylene jar with plastic balls and then melted in a platinum crucible at 800°-1000° C. The melt is heated at the peak temperature for a period of 1-1-½ hours. The melt is then poured into cold water. The maximum temperature of the water during quenching is kept as low as possible by increasing the volume of water-to-melt ratio. The crude frit, after separation from water, is freed from residual water by drying in air or by displacing the water by rinsing with methanol. The crude frit is then milled for 3-5 hours in alumina containers using alumina grinding media. Alumina picked up by the materials, if any, is not within the observable limit as measured by x-ray diffraction analysis.

After discharging the milled frit slurry from the mill, excess solvent is removed by decantation and the frit powder is air dried at room temperature. The dried powder is then screened through a 325-mesh screen to remove any large particles.

D. Organic Medium

The inorganic particles are mixed with an organic liquid medium (vehicle) by mechanical mixing to form a pastelike composition having suitable consistency and rheology for screen printing. The paste is then printed as a "thick film" on dielectric or other substrates in the conventional manner.

Any inert liquid may be used in the vehicle so long as it volatilizes out cleanly upon drying and firing. Various organic liquids, with or without thickening and/or stabilizing agents and/or other additives, may be used as the vehicle. Exemplary of organic liquids which can be used are the aliphatic alcohols, esters of such alcohols, for example, acetates and propionates, terpenes such as pine oil, terpineols and the like, solutions of resins such as the polymethacrylates of lower alcohols, and solutions of ethyl cellulose in solvents such as pine oil, and the monobutyl ether of ethylene glycol monoacetate. The vehicle may also contain volatile liquids to promote fast drying after application to the substrate.

Even though a wide variety of inert liquids can be used in the organic medium, it has nevertheless been found that, unlike conventional thick film compositions, it is better if the organic polymer content of the organic medium used in the invention is maintained within quite narrow limits. In particular, it is preferred that the content of such polymeric materials, e.g., ethyl cellulose and methacrylate resins, be maintained at a level no higher than 1.0% by weight of the solids content of the dispersion. A polymer level no higher than 0.5% by weight is preferred, especially when nonacrylic polymers such as ethyl cellulose are used in the organic medium. Somewhat higher polymer levels in the organic medium can be tolerated if the nitrogen firing atmosphere contains several ppm oxygen in the burnout zone of the furnace.

In theory, it would be desirable to have no resin at all in the organic medium. However, as a practical matter, the organic medium must contain at least about 1 to 3% by weight resin in order to obtain suitable rheological properties in the dispersion and adequate green strength in the applied copper film when it is applied by screen printing.

The ratio of organic medium to solids in the dispersion can vary considerably and depends upon the manner in which the dispersion is to be applied and the kind of vehicle used. Normally, to achieve good coverage, the dispersions will contain complementally 70-90% solids and 30-10% vehicle.

In formulating the compositions of the invention, it is preferred to minimize the amount of organic medium and also, as indicated above, to minimize the amount of high molecular weight materials in the organic medium. The reason for this in both instances is to provide for complete volatilization of the organic medium. The amount of oxygen available for volatilization of the organic medium by oxidation is, of course, quite limited because of the necessity of firing the copper in a nonoxidizing atmosphere. Therefore, in the formulation of the composition, the rheology is adjusted to obtain the desired printing viscosity with the least possible amount of organic medium. Thus, both to decrease the viscosity as well as to enhance volatilization of the organic medium, it is also preferred to limit the amount of resin in the organic medium to a level of 10% by weight or below, which corresponds to less than 1.0% by weight of the total formulation. The compositions of the present invention may, of course, be modified by the addition of other materials which do not adversely affect its beneficial characteristics. Such formulation is well within the skill of the art.

The viscosity of the pastes for screen printing is typically within the following ranges when measured on a Brookfield HBT Viscometer at low, moderate and high shear rates:

| Shear Rate (Sec$^{-1}$) | Viscosity (Pa · S) | |
|---|---|---|
| 0.2 | 100–5000 | — |
| | 300–2000 | Preferred |
| | 600–1500 | Most preferred |
| 4 | 40–400 | — |
| | 100–250 | Preferred |
| | 140–200 | Most preferred |
| 384* | 7–40 | — |
| | 10–25 | Preferred |
| | 12–18 | Most preferred |

*Measured on HBT Cone and Plate Model Brookfield Viscometer.

The amount of vehicle utilized is determined by the final desired formulation viscosity.

Formulation and Application

In the preparation of the composition of the present invention, the particulate inorganic solids are mixed with the organic carrier and dispersed with suitable equipment to form a suspension, resulting in a composition for which the viscosity will be in the range of about 100–250 Pa.S at a shear rate of 4 sec$^{-1}$.

In the examples which follow, the formulation was carried out in the following manner: The ingredients of the paste, minus about 5% organic components equivalent to about 0.5% wt. of the formulation, are weighed together in a container. The components are then vigorously mixed to form a uniform blend; then the blend is passed through dispersing equipment to achieve good dispersion of particles. A Hegman gauge is used to determine the state of dispersion of the particles in the paste. This instrument consists of a channel in a block of steel that is 25 $\mu$m deep on one end and ramps up to 0 depth at the other end. A blade is used to draw down paste along the length of the channel. Scratches will appear in the channel where the diameter of the agglomerates is greater than the channel depth. A satisfactory dispersion will give a fourth scratch point of 10–15 $\mu$m typically. The point at which half of the channel is uncovered with a well dispersed paste is between 3 and 8 $\mu$m typically. Fourth scratch measurement of >20 $\mu$m and "half-channel" measurements of >10 $\mu$m indicate a poorly dispersed suspension.

The remaining 5% consisting of organic components of the paste is then added and the content of organic medium is adjusted to bring the viscosity when fully formulated to between 140 and 200 Pa.S at a shear rate of 4 sec$^{-1}$.

The composition is then applied to a substrate such as alumina, silica-alumina or various dielectric materials usually by the process of screen printing to a wet thickness of about 25-80 microns, preferably 25-60 microns and most preferably 25-35 microns. The conductor compositions of this invention can be printed onto the substrate either by using an automatic printer or a hand printer in the conventional manner. Preferably automatic screen stencil techniques are employed using 200- to 325-mesh screens. The printed pattern is then dried at below 200° C., e.g., 120°-150° C., for about 5-15 minutes before firing. Firing to effect sintering of both the inorganic binder and the finely divided copper particles is preferably done in a belt conveyor furnace under a nitrogen atmosphere with a temperature profile that will allow burnout of the organic matter at about 300° C. and densification of the thick film on heating on 850°-950° C. This is followed by a controlled cooldown cycle to prevent over-sintering, unwanted chemical reactions at intermediate temperatures or substrate fracture which can occur from too rapid cooldown. The overall firing procedure will preferably extend over a period of about 1 hour, with 20-25 minutes to reach the peak firing temperature, about 10 minutes at the firing temperature and about 20-25 minutes in cooldown. In some instances, total cycle times as short as 30 minutes can be used. During firing of dried copper films, the oxygen concentration in the hot sections of the furnace should be maintained below 15-20 ppm and preferably below 10 ppm to minimize oxidation of the copper.

The conductor composition of the invention can be used to make thick film resistor networks by the following sequence of steps:
 (1) applying to a ceramic substrate a patterned terminating layer of the conductor composition of claim 1;
 (2) firing the patterned conductor layer in a nonoxidizing atmosphere to effect volatilization of the organic medium, decomposition of the copper oxide and sintering of the inorganic binder;
 (3) applying to the substrate and the fired conductor layer a patterned layer of thick film resistor paste comprising an admixture of finely divided particles of resistance material and inorganic binder dispersed in organic medium; and
 (4) firing the patterned resistor layer in a nonoxidizing atmosphere to effect volatilization of the organic medium and sintering of the inorganic binder.

The conductor compositions of the invention can also be used to make multilayer interconnections for complex electronic circuits by the following sequence of steps.
 (1) applying to a ceramic substrate a patterned layer of the conductor composition of claim 1;
 (2) firing the patterned conductor layer in a nonoxidizing atmosphere to effect volatilization of the organic medium, decomposition of the copper oxide and sintering of the inorganic binder;
 (3) applying to the substrate and the fired conductor layer a patterned layer of thick film dielectric paste comprising an admixture of finely divided particles of dielectric solids and inorganic binder dispersed in organic medium, the patterned layer having vias communicating with the underlying conductive layer;
 (4) firing the patterned dielectric layer in a nonoxidizing atmosphere to effect volatilization of the organic medium and sintering of the inorganic binder;
 (5) applying over the fired dielectric layer a patterned layer of, and filling the vias with, the conductor composition of claim 1;
 (6) firing the patterned conductor layer and the filled vias in a nonoxidizing atmosphere to effect volatilization of the organic medium, decomposition of the copper oxide and sintering of the inorganic binder; and
 (7) repeating the sequence of steps (3) to (6), to build up the required number of layers.

Multilayered interconnections containing as many as 20 layers are frequently made in this manner.

Test Procedures

Adhesion: The adhesion was measured using an "Instron" pull tester in a 90° peel configuration at a pull rate of 2 inches per minute. Twenty gauge pre-tinned wires were attached to 80 mil×80 mil pads by solder dipping for 10 seconds in 62Sn/36 Pb/2Ag solder at 220° C. or in 63Sn/37 Pb solder at 230° C. using Alpha 611 flux. (Alpha 611 is a tradename for solder flux made by Alpha Metals Inc., Jersey City, N.J.) Aging studies were carried out in a Blue M Stabil-Therm ® oven controlled at 150° C. After aging, test parts were allowed to equilibrate several hours in air before the wires were pulled.

Solderability: The solderability tests were performed as follows: The fired parts were dipped in a mildly active rosin flux such as Alpha 611, then heated for 3 seconds by dipping the edge of the ceramic chip in the molten solder. The chip was then submerged in the solder for 10 seconds, withdrawn, cleaned and inspected. Solderability was determined by the percentage of solder coverage (buildup) obtained on the copper test pattern.

Particle Size: The size of particles used in the invention was measured with a Sedi Graph 5000D Particle Size Analyzer. This instrument determines the concentration of particles remaining at decreasing sedimentation depths as a function of time. The logarithm of the difference in transmitted x-ray intensity is electronically generated and converted to present these data as a cumulative mass percent distribution in terms of Stokesian or equivalent spherical diameter in microns ($\mu$m).

EXAMPLES

In the examples which follow, all proportions are given in weight percentages (% wt.) unless otherwise indicated. In addition, the composition and properties of certain components of the exemplified thick film conductive materials are as follows:

TABLE 1

| Designation Properties | PROPERTIES OF COPPER POWDERS | | | |
|---|---|---|---|---|
| | A | B | C | D |
| % wt. below 10 $\mu$m | 99.9 | 99.9 | 99.9 | 99.9 |
| Avg. Particle Size, $\mu$m | 2.2 | 4.0 | 3.0 | 1.2 |
| Surface Area, m2/g | 0.3 | 0.25 | 0.3 | 1.20 |
| % Wt. Oxygen | 1.0 | 0.1 | 0.5 | 0.4 |

TABLE 2
COMPOSITION AND SOFTENING POINT OF INORGANIC BINDERS

| Designation | A | B | C | D |
|---|---|---|---|---|
| Composition | | % Wt. | | |
| PbO | 66.9 | 78.1 | 58.8 | 80.6 |
| $B_2O_3$ | 12.3 | — | 7.8 | 12.0 |
| $SiO_2$ | 10.3 | — | 23.0 | 6.0 |
| CdO | 6.8 | — | 3.9 | — |
| NaF | 3.5 | — | — | — |
| $Al_2O_3$ | 0.2 | — | 0.4 | — |
| ZnO | — | — | — | 1.4 |
| $GeO_2$ | — | 21.9 | — | — |
| $TiO_2$ | — | — | 6.1 | — |
| | 100.0 | 100.0 | 100.0 | 100.0 |
| Softening Point, °C. | 420 | — | 560 | 430 |

TABLE 3
ORGANIC MEDIUM COMPOSITION

| | |
|---|---|
| Ethyl Cellulose | 5.2% Wt. |
| α,β-Terpineol | 11.4 |
| Dibutyl Carbitol[1] | 28.5 |
| Dibutyl Phthalate | 51.5 |
| Tridecyl Phosphate | 1.3 |
| Ionol[2] | 2.1 |
| | 100.0 |

[1]Tradename of Union Carbide Co., New York, NY for diethylene glycol dibutyl ether.
[2]Tradename of Shell Chemical Co., Houston, TX for 2,6-di-tertbutyl-4-methyl phenol.

EXAMPLES 1-10

A series of ten copper-containing thick film conductor composition of widely varying compositions was prepared in the manner described above and tested to demonstrate the various parameters of both composition and component properties. Except as noted, each of the compositions was used to prepare a fired thick film conductor as described above and the conductor was tested as to resistivity, solderability and adhesion. These data are given in Table 4 below:

TABLE 4
COMPOSITION OF COPPER-CONTAINING THICK FILM CONDUCTOR COMPOSITIONS AND PROPERTIES OF CONDUCTORS MADE THEREFROM

| Example No. | 1 | 2 | 3 | 4 | 5 | 6 | 7 | 8 | 9 | 10 |
|---|---|---|---|---|---|---|---|---|---|---|
| Composition | | | | | | | | | | |
| Cu Powder A | 89.0 | — | — | — | — | — | 89.0 | 90.0 | 89.0 | 88.0 |
| B | — | 84.0 | — | — | 88.0 | 84.0 | — | — | — | — |
| C | — | — | 86.0 | — | — | — | — | — | — | — |
| D | — | — | — | 82.4 | — | — | — | — | — | — |
| Binder A | 1.6 | 1.6 | 1.6 | — | 1.6 | — | — | 1.6 | 1.6 | 1.6 |
| B | — | — | — | 1.6 | — | 2.0 | — | — | — | — |
| C | — | — | — | — | — | — | 1.5 | — | — | — |
| D | — | — | — | 1.0 | — | — | — | — | — | — |
| $PbO_2$ | 0.4 | 0.4 | 0.4 | — | 0.4 | — | 0.5 | 0.4 | 0.4 | 0.4 |
| $Cu_2O$ | — | 5.0 | 3.0 | 4.0 | 1.0 | 5.0 | — | — | — | — |
| W Powder, 1.5 μm avg. particle size | 1.0 | 1.0 | 1.0 | 1.0 | 1.0 | 1.0 | 1.0 | — | 1.0 | 2.0 |
| Organic Medium | 8.0 | 8.0 | 8.0 | 10.0 | 8.0 | 8.0 | 8.0 | 8.0 | 8.0 | 8.0 |
| Total oxygen as copper oxide | 0.9 | 0.6 | 0.7 | 0.7 | 0.2 | 0.6 | 0.9 | 0.9 | 0.9 | 0.9 |
| Conductor Properties | | | | | | | | | | |
| Resistivity, mΩ/□/mil | 1.5 | 1.4 | 1.5 | 1.7 | 1.7 | 1.5 | 1.4 | 1.4 | 1.3 | 1.4 |
| Solderability, % | | | | | | | | | | |
| On Alsimag ® 614-Fired 1× | 95 | 95 | 95 | 85 | 95 | 95 | 95 | 10 | 95 | 95 |
| -Fired 3× | 95 | 95 | 95 | 80 | 95 | 95 | 95 | 0 | 95 | 95 |
| On Du Pont Dielectric 4575 | | | | | | | | | | |
| -Fired 1× | 95 | 95 | 95 | 80 | 95 | 95 | 90 | 10 | 95 | 95 |
| -Fired 3× | 90 | 95 | 95 | 70 | 95 | 90 | 90 | 0 | 90 | 95 |
| Adhesion, Newtons | | | | | | | | | | |
| On Alsimag 614-Fired 1× | 25 | 27 | 25 | 20 | 10 | 24 | 26 | — | 24 | 18 |
| On Du Pont Dielectric 4575 | | | | | | | | | | |
| -Fired 5× | 27 | 30 | 28 | 20 | 14 | 28 | 29 | — | 24 | 20 |
| -Fired 5×, aged 200 hrs. at 150° C. in air | 25 | 25 | 24 | 17 | 7 | 22 | 25 | — | 21 | 19 |

The compositions of Examples 1-3 and 8, which contained the same inorganic binder, were formulated with Cu powders of varying particle size (2-4 μm) and copper oxide (oxygen) content. All those which contained tungsten metal powder exhibited quite excellent solderability on both substrates even after five firings. However, the composition which contained no tungsten powder had extremely low solderability after one firing and became almost completely unsolderable upon repeated firings.

The data of Example 5 in comparison with the data of Example 2 illustrate the importance of having sufficient oxygen as copper oxide in the composition to assure both good solderability and adhesion. Thus, while adequate solderability can still be obtained with low oxide composition of the copper particles, the equally important adhesion properties were undesirably low. Example 5 also shows the importance of using particles of copper having a relatively low surface area, i.e., no higher than about 1 $m^2/g$.

The excellent solderability and adhesion of Examples 1, 4, 6 and 7, which used quite different inorganic binders, show that the composition of the binder is not particularly critical so long as the other criteria of the invention-oxygen content, particle sizes and tungsten content-are met.

Examples 1, 9 and 10 which contain successively higher amounts of tungsten metal show that about 2.0% wt. tungsten metal may be used without serious adverse effect on adhesion. Comparison of Example 8, which contained no tungsten metal, with either of Examples 9 or 10 shows the vital role of tungsten in the composition of the invention even when the other criteria of the invention are met.

EXAMPLES 11-15

A series of five copper-containing thick film conductor compositions was prepared in which the composition of each member of the series was essentially the same except for progressively increasing the concentration of noncuprous metal, which in this case was tungsten. The five conductor compositions were prepared in the same manner as Examples 1-10. Each of the compositions was used to prepare a fired thick film conductor as described above and the conductor was tested as to resistivity, solderability and adhesion. These data are given in Table 5 below:

TABLE 5
EFFECT OF NONCUPROUS METAL
CONCENTRATION ON CONDUCTOR PROPERTIES

| Example No. | 11 | 12 | 13 | 14 | 15 |
|---|---|---|---|---|---|
| Composition | | | | | |
| Cu Powder C | 85.0 | 84.0 | 83.0 | 81.0 | 76.0 |
| Binder A | 1.6 | 1.6 | 1.6 | 1.6 | 1.6 |
| $PbO_2$ | 0.4 | 0.4 | 0.4 | 0.4 | 0.4 |
| $Cu_2O$ | 4.0 | 4.0 | 4.0 | 4.0 | 4.0 |
| W Powder, 1.5 μm avg. particle size | 1.0 | 2.0 | 3.0 | 5.0 | 10.0 |
| Organic Medium | 8.0 | 8.0 | 8.0 | 8.0 | 8.0 |
| Total oxygen as copper oxide | 0.8 | 0.8 | 0.8 | 0.8 | 0.8 |
| Conductor Properties | | | | | |
| Resistivity, mΩ/□/mil | 1.2 | 1.1 | 1.2 | 1.1 | 1.2 |
| Solderability, % | | | | | |
| On Alsimag ® 614-Fired 1X | 95 | 95 | 95 | 95 | 85 |
| -Fired 3X | 95 | 95 | 95 | 90 | 90 |
| On Du Pont Dielectric 4575 | | | | | |
| -Fired 1X | 95 | 95 | 95 | 95 | 90 |
| -Fired 3X | 95 | 95 | 95 | 95 | 95 |
| Adhesion, Newtons | | | | | |
| On Alsimag 614-Fired 1X | 33 | 22 | 20 | 15 | 4 |
| On Du Pont Dielectric 4575 | | | | | |
| -Fired 5X | 24 | 24 | 27 | 15 | 10 |
| -Fired 5X aged 200 hrs. at 150° C. in air | 25 | 21 | 25 | 9 | 6 |

The foregoing also show that high amounts of noncuprous metal (in this case, tungsten) were quite harmful to substrate adhesion. In particular, the data show above about 5.0% wt. tungsten, adhesion becomes increasingly unsatisfactory. Moreover, the data show that no more than about 3.0% wt. tungsten is preferable since both solderability and adhesion are quite high.

EXAMPLE 16

A further thick film composition was formulated and conductors made therefrom were tested in the manner of the previous examples. The composition had the same components as Example 11 except that molybdenum powder was substituted for tungsten. The conductor made therefrom had a resistivity of 1.6 mΩ/□/mil. Solderability on Alsimag ®614 was 95% after 3X firing and on Du Pont Dielectric 4575 was 90% after 3X firing. Adhesion on Alsimag ®614, fired 1X, was 19 newtons and on Du Pont Dielectric 4575, fired 5X, was 20 newtons.

These data show that molybdenum metal is similarly effective to tungsten in its ability to improve the adhesion and solderability of multifired copper conductive layers.

I claim:

1. A method of making a thick film resistor comprising the sequential steps of:
    1. applying to a ceramic substrate a patterned terminating layer of a thick film conductor composition comprising a mixture of finely divided particles of:
        a. 85-98.8% wt. conductive material consisting essentially of 28-100% wt. copper and 72-0% wt. noble metal;
        b. 10-1% wt. inorganic binder having a softening point below 800° C.; and
        c. 5-0.2% wt. of a noncuprous material selected from the group consisting of tungsten, molybdenum, rhenium and alloys and mixtures thereof dispersed in organic medium, the composition being further characterized in that:
        (1) the copper particles have a maximum size below 10 μm and an average size of 2-4 μm; and
        (2) the noncuprous metal particles have a maximum size below 5 μm and an average size of 0.2-3 μm.
    2. firing the patterned conductor layer in a nonoxidizing atmosphere to effect volatilization of the organic medium, decomposition of the copper oxide and sintering of the inorganic binder;
    3. applying to the substrate and the fired conductor layer a patterned layer of thick film resistor paste comprising an admixture of finely divided particles of resistance material and inorganic binder dispersed in organic medium; and
    4. firing the patterned resistor layer in a nonoxidizing atmosphere to effect volatilization of the organic medium and sintering of the inorganic binder.

2. A method of making multilayer interconnection package comprising the sequential steps of:
    1. applying to a ceramic substrate a patterned layer of a thick film conductor composition comprising a mixture of finely divided particles of:
        a. 85-98.8% wt. conductive material consisting essentially of 28-100% wt. copper and 72-0% wt. noble metal;
        b. 10-1% wt. inorganic binder having a softening point below 800° C.; and
        c. 5-0.2% wt. of a noncuprous material selected from the group consisting of tungsten, molybdenum, rhenium and alloys and mixtures thereof dispersed in organic medium, the composition being further characterized in that:
        (1) the copper particles have a maximum size below 10 μm and an average size of 2-4 μm; and
        (2) the noncuprous metal particles have a maximum size below 5 μm and an average size of 0.2-3 μm.
    2. firing the patterned conductor layer in a nonoxidizing atmosphere to effect volatilization of the organic medium, decomposition of the copper oxide and sintering of the inorganic binder;
    3. applying to the substrate and the fired conductor layer a patterned layer of thick film dielectric paste comprising an admixture of finely divided particles of dielectric solids and inorganic binder dispersed in organic medium, the patterned layer having vias communicating with the underlying conductive layer;
    4. firing the patterned dielectric layer in a nonoxidizing atmosphere to effect volatization of the organic medium and sintering of the inorganic binder;

5. applying over the fired dielectric layer a patterned layer of, and filling the vias with, the conductor composition of claim 11;
6. firing the patterned conductor layer and the filled vias in a nonoxidizing atmosphere to effect volatilization of the organic medium, decomposition of the copper oxide and sintering of the inorganic binder; and
7. repeating the sequence of steps 3 to 6.